United States Patent
Ogura

(10) Patent No.: US 6,180,461 B1
(45) Date of Patent: Jan. 30, 2001

(54) DOUBLE SIDEWALL SHORT CHANNEL SPLIT GATE FLASH MEMORY

(75) Inventor: Seiki Ogura, Wappingers Falls, NY (US)

(73) Assignee: Halo LSI Design & Device Technology, Inc., Wappingers Falls, NY (US)

( * ) Notice: Under 35 U.S.C. 154(b), the term of this patent shall be extended for 0 days.

(21) Appl. No.: 09/128,585

(22) Filed: Aug. 3, 1998

(51) Int. Cl.[7] ............................................. H01L 21/8247
(52) U.S. Cl. ............................................. 438/266; 438/596
(58) Field of Search ..................................... 438/257, 264, 438/266, 267, 304, 593, 594, 595, 596

(56) References Cited

U.S. PATENT DOCUMENTS

| | | | |
|---|---|---|---|
| 5,268,585 | * 12/1993 | Yamauchi | 438/267 |
| 5,284,794 | * 2/1994 | Manley | 438/267 |
| 5,760,435 | * 6/1998 | Pan | 438/267 |
| 5,780,341 | 7/1998 | Ogura | 438/259 |
| 5,998,265 | * 12/1999 | Fukimoto | 438/266 |

OTHER PUBLICATIONS

M. Kamiya et al. "EEPROM Cell With High Gate Injection Efficiency" Pub. in IEDM, 1992, p. 741.
Y. Yamauchi, A 5V–Only Virtual Grand Flash Cell With An Auxiliary Gate For High Density and High Speed Application, Pub. in IEDM, 1991, pp. 11.7.1–11.7.4.

* cited by examiner

Primary Examiner—Chandra Chaudhari
(74) Attorney, Agent, or Firm—George O. Saile; Stephen B. Ackerman

(57) ABSTRACT

An electrically programmable read only memory device which has efficiency of electron injection from channel to floating gate is provided. This memory cell includes a control gate and floating gate between source and drain regions. The region under the floating gate has extremely small enhanced mode channel and N region. Therefore, this channel is completely depleted by the program drain voltage. The enhanced mode channel region is precisely defined by the side wall spacer technique. Also, the N drain region is accurately defined by the difference of side wall polysilicon gate and the first spacer.

10 Claims, 4 Drawing Sheets

DOUBLE SIDEWALL SHORT CHANNEL SPLIT GATE FLASH MEMORY

BACKGROUND OF THE INVENTION

1) Field of the Invention

This invention relates to an electrically programmable read only memory (EPROM) device and a method of making this device which has high efficiency of electron injection to the floating gate.

2) Description of the Prior Art

The channel hot electron (CHE) injection transistor with step split was described and claimed in Seiki Ogura U.S. Pat. No. 5,780.341. The effective horizontal channel length under the floating gate of that U.S. Patent was designed to be very short.

M. Kamiya et al "EEPROM Cell With High gate injection Efficiency" published in IEDM, 1982, page 741 describes conventional split gate source-side injection transistor.

Y. Yamauchi, "A 5V-Only Virtual Ground Flash Cell with An Auxiliary Gate for High Density and High Speed Application", published in IEDM 1991, page 11.7.1 describes a Flash EEPROM device and method for making the device. The memory device seems similar to the present invention, but is structurally different and the method for fabricating is much different. Further, the device cannot give the efficiency of electron injection from channel to floating gate that is possible in the present invention.

SUMMARY OF THE INVENTION

The short channel step device of the Ogura U.S. Pat. No. 5,780,341 has given a few orders of injection efficiency improvement over conventional source side injection devices. However, it has also been found that this short channel split gate device has very high injection efficiency, at low voltages, even without the step. The planar short channel split gate device of the present invention has been found to have an injection efficiency of one order less than that for a step device, at similar low voltages and currents. The reduced process complexity for the planar short channel device is advantageous where injection can be slightly slower than, but still operate at low voltages similar to the step device. Simulation analysis reveals that the programming mechanism for the short channel split gate device is very different from the conventional split gate source-side injection transistor described by M. Kamiya et al cited above, even though the structures may resemble each other as seen in the Yamauchi cited above.

For a split gate device in which the distance between word gate to n-region (effective FG horizontal channel) is less than about 100 nm (preferably less than about 50 nm), and defined by a controllable double side wall technique, high injection efficiency can be obtained by phonon scattering without undesirable channel electron-electron scattering effects. The injection mechanism of this transistor is characterized by:

(i) the effective FG horizontal channel is almost completely depleted by a drain voltage of 3.2V the oxide barrier height is 3.2 eV, therefor, the drain voltage of about 3.2V is required to create high energy electrons cross the oxide barrier for substrate bias of 0 volts, and (ii) Electron injection begins when the floating gate potential is almost the same as the 3.2V minimum drain voltage.

The device structure obtained by this double side wall technique of this invention resembles the side wall floating gate split device of Yamauchi cited above. Both have horizontally planar channels. However, the device operation for this short channel device of the invention is completely different from the conventional split gate source side injection Transistor. Until now, the distance between the word gate edge and the N junction edge has been larger than 0.15 microns, even for the split-side wall gate transistor as shown by Yamauchi cited above. As a result, it has been necessary to raise the voltage of the side wall floating gate to pass the drain voltage through. For example, in order to create 3.2 V near the oxide gap under the floating gate, (close to the oxide barrier height for injection), the floating gate voltage must be at least 3.2V+$V_T$ (1.3V)=4.5V. When the length of the overlapped N region is close to that of the channel length, and the coupling ratio from drain to floating gate is about 0.5, the drain voltage has to be 7V with word gate voltage of 2V, in order to obtain the 4.5V floating gate voltage required for reasonable programming speed.

On the other hand, the channel of the new device of the invention is very short, less than about 100 nm (and preferably less than about 50 nm), and the N drain is very close to the word gate edge. In this structure, at a drain voltage of 3.2V and floating gate of 3.2V, the enhanced channel becomes almost completely depleted, achieving good programming conditions without the higher floating gate voltage requirement. Coupling ratios are actually improved by the smaller channel length. Assuming a coupling ratio of 0.5 for consistency, a drain voltage of 4.4V is required to achieve floating gate voltage of 3.2V. Further improvement of the coupling ratio can obtain good programming conditions even for a low drain voltage of 4V. Thus, this new double side wall short channel device of the present invention reduces the drain voltage requirement for source side injection operation from 7V to 4V. This reduced high voltage requirement will ease charge pump design, and improve scalability.

Unlike the conventional split gate transistor in which polysilicon width is optically defined to be about 30% of the minimum ground rule, definition of the floating gate dimensions for the new device of the invention is defined by the side wall spacer technique. The side wall spacer technique used by the method of the invention is very controllable to within a few percent (+/−5%).

By utilizing the side wall technique twice in the method of the invention, a very short enhancement mode channel of less than about 100 nm (preferably less than about 50 nm), and an N/N+ region which is a few times larger, can be precisely formed.

(i) A precisely controllable, very short enhanced mode channel (less than about 50 nm) with profile about 5E17 $cm^2$, is almost completely depleted when 3V is applied to the drain and the floating gate voltage is also around 3V.

(ii) Since the N/N+ region under the floating gate is few times larger (between about 150 to 300 nm), capacitive coupling only needs to raise the floating gate potential to be close to 3V, with the drain voltage of 4V, which can be easily achieved. By comparison Source Side Injection device requires at least 7V.

(iii) Since 3.2V is applied over this less than about 100 nm channel, a very high electric field of about 5E5 V/cm is created and electrons that are released from the word gate edge achieve high energy and inject into the floating gate (barrier height=about 3.1 eV).

(iv) Thus this less than about 100 nm short channel utilizing the double side wall technique provides high electron injection efficiency at low gate and drain voltages of about 3V, reducing the high voltage requirement by almost half compared to the Source Side injection transistor.

The method of fabricating an electrically programmable split gate memory device which has efficiency of electron injection from the channel to floating gate is accomplished with reduced process complexity and consistently reproducible results. The method provides a substrate having a source region with an adjacent channel and a control gate over said channel. A drain region is formed having a floating gate beside said control gate, separated by a oxide layer from said control gate, said floating gate is located over said drain region. The horizontal distance between the vertical edge of said control gate to the closest edge of said drain is less than about 100 nm (preferably less than about 50 nm). The horizontal distance is reproducible between +/−5% because of the use of the side wall spacer technique.

A second method of fabricating an electrically programmable split gate memory device which has efficiency of electron injection from the channel to a floating gate includes the following steps. A substrate is provided having a source region with an adjacent channel and a control gate over said channel. A first floating gate oxide layer is formed over the sidewall of the control gate. A silicon nitride sidewall spacer layer is formed over the first floating gate oxide layer on the sidewall of the control gate. The silicon nitride spacer layer is used as a mask to form an N region within said substrate in the area whereat a floating gate is to be formed. The silicon nitride spacer layer is removed. A second floating gate oxide layer is formed over the substrate. The formation of an N+ drain region within said N region is completed by using the control gate as the mask. The floating gate is formed at the side of the control gate and over said first and second floating gate oxide layers on the side wall of the control gate and the substrate.

DESCRIPTION OF THE PREFERRED EMBODIMENTS

This invention describes a new, high-density flash memory, called "double side wall short channel split gate". The major features of the inventions illustrated in FIGS. 1 through 8 method are: (i) That a silicon nitride spacer is used to define the distance between the word gate polysilicon edge to the N drain region edge to be less than about 100 nm (preferably less than about 50 nm). An extra P channel region is optionally implanted with P boron species to adjust the channel doping after the first side wall silicon nitride spacer is removed. (ii) The second spacer is polysilicon and defines the floating gate. The polysilicon thickness and N length measured from N edge to N+ diffusion is determined by the polysilicon side wall spacer. Thus the drain-FG coupling capacitance can be accurately controlled by the length of the N region, which is equal to the difference of the two spacer thicknesses.

Figure 7:
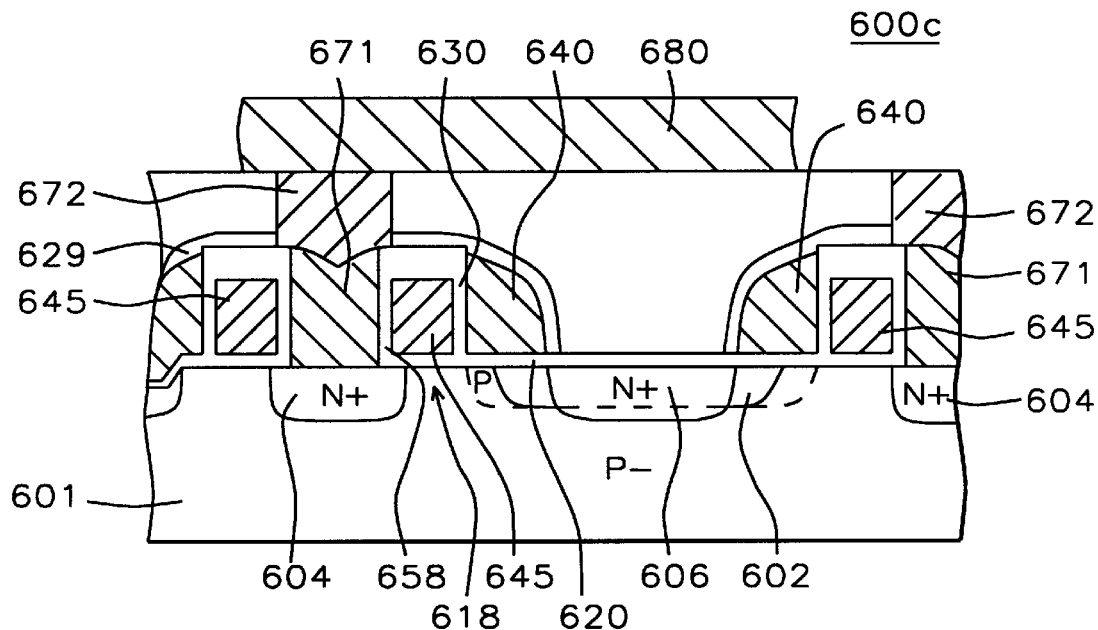

FIGS. 1 through 8 show a fabrication method for a variation of the split gate transistor 600c, wherein the channel length (excluding 602 N region) under the floating gate is very short, typically less than about 100 nm (preferably less than about 50 nm). The transistor variation described in this invention is fabricated using the same basic method as for transistor 600c shown in FIG. 7, excluding the step formation procedures, which results in the short channel, planar transistor as shown in FIG. 7. The small p-channel region under the floating gate is accurately defined by double side wall techniques.

Figure 1:
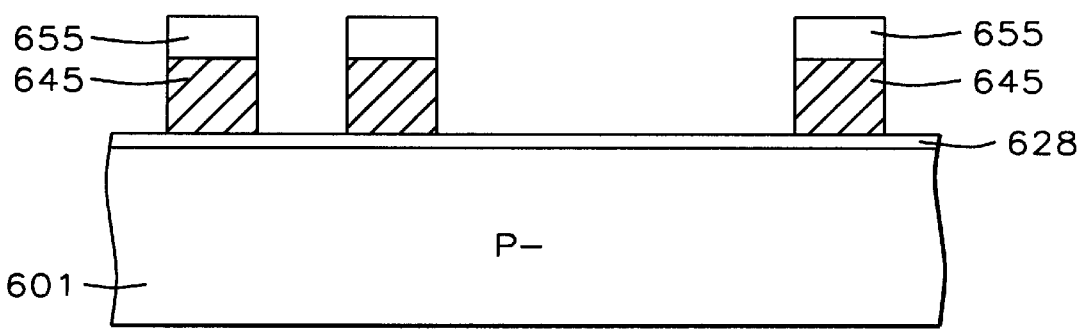
FIGS. 1–7 are schematically shown cross-sections of the fabrication of the double side wall short channel split flash transistor of the present invention, during various stages in the process. The resulting enhancement mode channel is less than about 100 nm and is defined by first side wall spacer. The length of the N region is determined by the difference of the last polysilicon spacer and the first spacer thickness.
Figure 2:
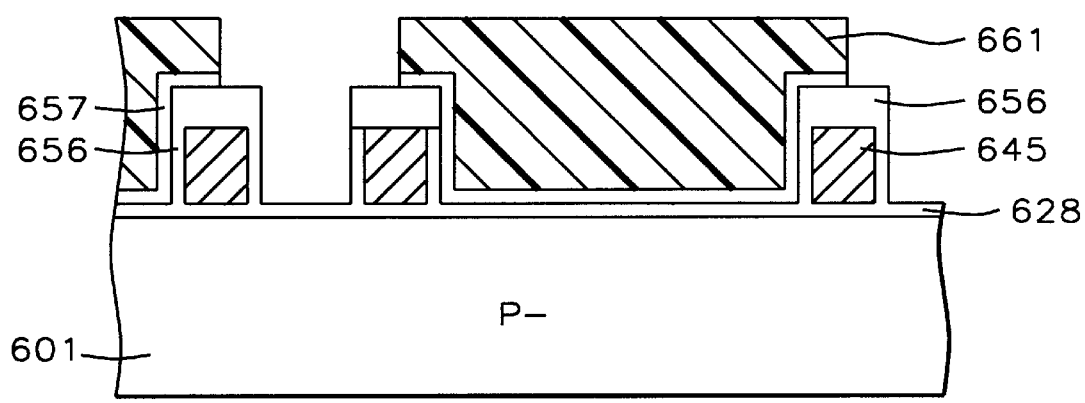
Figure 3:
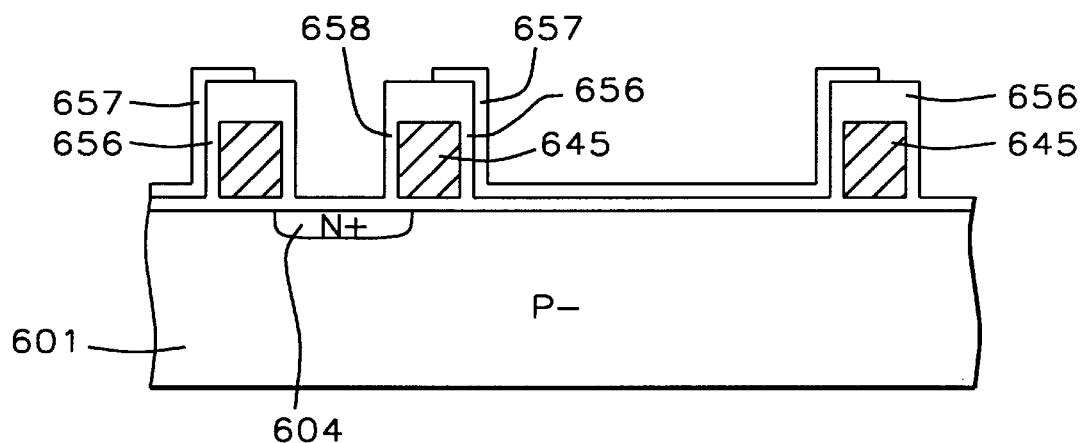
Figure 4:
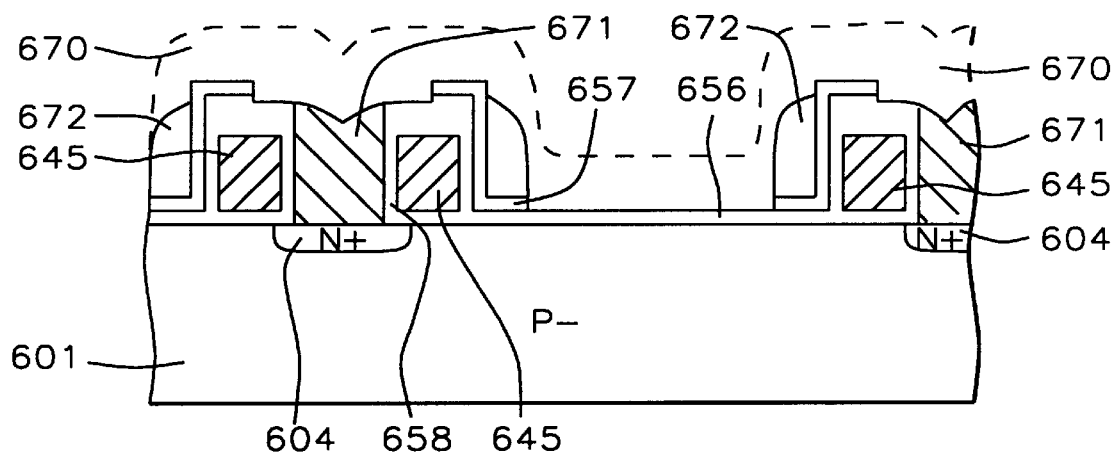
Figure 5:
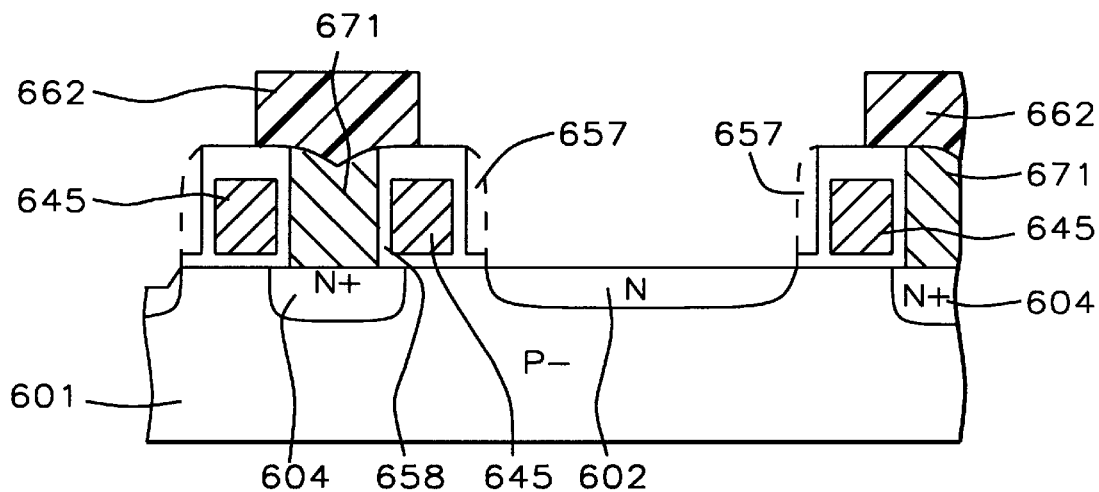
Figure 6:
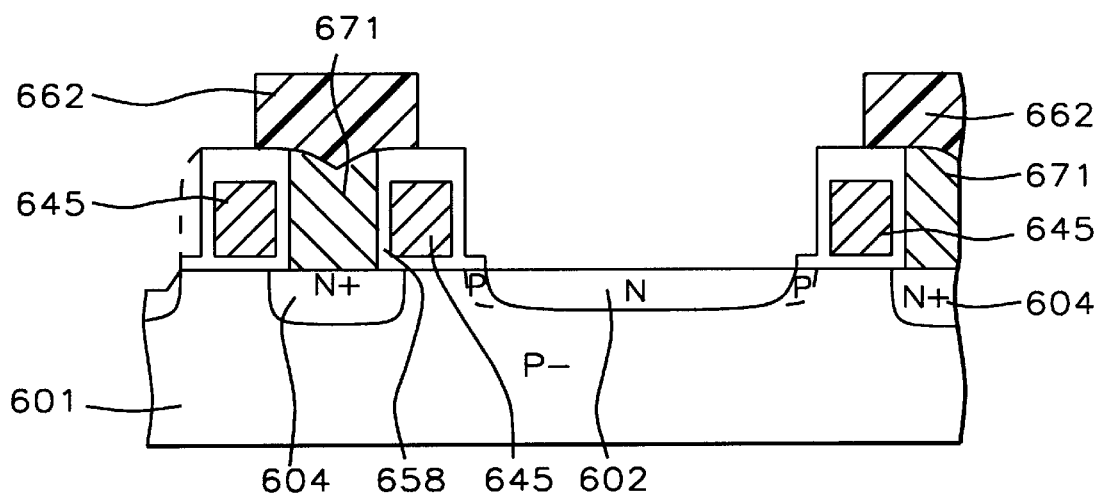

After device isolation of LOCOS, or shallow trench isolation as is well known in the art, word line control gate 645 is defined as shown in FIG. 1 where the height of the polysilicon layer 645 is between about 200 nm to 400 nm and the polysilicon layer is covered with a dielectric layer 655 of about 50 nm. Then a thin silicon oxide layer (10–20 nm) 656 is thermally grown over polysilicon side wall and followed by thin silicon nitride 657 deposition by Chemical Vapor Deposition in FIG. 2. Here, the silicon nitride thickness determines the horizontal channel length (less than about 100 nm). Photoresist layer 661 is applied to define contact and logic devices area. Using the photoresist mask, the silicon nitride film 657 is isotropically etched by RIE and ion species of Arsenic is implanted to form the N+ source junction. After removing the photoresist, the side wall silicon oxide (about 50–80 nm) 658 in FIG. 3 is thermally grown selectively in the contact hole area which is several times thicker than that for 656 of the other side of polysilicon gate 645. The bottom silicon oxide of contact hole is vertically etched by RIE, during which, the silicon nitride 656 prevents oxidation of the area underneath and also acts as an etch stop during etching of the silicon oxide over junction N+ 604. Polysilicon 670 with a thickness of between about 180 to 200 nm is deposited as shown by dotted line in FIG. 4. Directional dry etch is performed to form side wall spacer 672. When the 0.3 microns lithography is used, the gate width and space 645 is 0.3 microns, so the contact opening after the thick side wall oxidation 658 is about 0.25 microns. Therefore, the contact hole 671 is still completely filled with this polysilicon even after polysilicon side wall etching when the polysilicon 670 is thicker than about 150 nm. The filled polysilicon is used to form the self aligned contact. Photoresist 662 is provided to protect polysilicon in the contact hole during removal of the side wall polysilicon. Another photoresist is applied and then removed from the area with a mask for where the side wall silicon nitride is desired to be removed. Then the silicon nitride 657 is vertically etched and the silicon nitride spacer shown by the dotted line in FIG. 5 is used to define the thermal silicon oxide under layer 656 shown in FIG. 4. Arsenic or Phosphorus for N drain 602 is implanted with a dosage in the range of between about 1E13 to 5E14 per cm$^2$ at 50–100 keV shown in FIG. 5. Then silicon nitride spacer 657 is removed selectively and isotropically by Chemical Dry Etch. Then an optional P, such as Boron to adjust V$_t$ under floating gate can be implanted in the range of about 1E12 to 1E13 per cm$^2$ at low energy, shown in FIG. 6. The silicon oxide under the spacer silicon nitride can be etched by a gentle oxide etch. Thermal oxide layer (between about 5–10 nm) is grown or LTO oxide is deposited over the channel region (oxide layer 620) and the side wall of polysilicon (oxide layer 630). The side wall oxide over polysilicon is slightly thicker than that over single crystal silicon substrate. Then the floating gate polysilicon is deposited conformally by CVD and vertically etched by RIE as shown in FIG. 7. The thickness of the polysilicon dictates the side wall dimension, which defines the floating gate length. Since the CVD thickness is controlled very tightly (within +/−5%), the small dimensions of horizontal channel length and Ln length are very accurately defined, to meet the precise design goals, by these two side wall processes of silicon nitride and polysilicon. After the side wall polysilicon etch, the floating gate and the contact polysilicon between adjacent cells are separated at the same time by using a photoresist mask (like the slit mask in a conventional floating gate EEPROM process) and by careful reactive ion etch, RIE marked as 640S and 671S in FIG. 8). The silicon nitride in the logic area can be used as an etch stop during the polysilicon gate spacer formation and removal. Then thermal oxidation of the polysilicon floating gate and deposition of CVD silicon oxide and silicon nitride & composite layer 629 follows. The purpose of composite layer 629 is to protect the floating gate polysilicon 640 from contamination and moisture.

Figure 8:
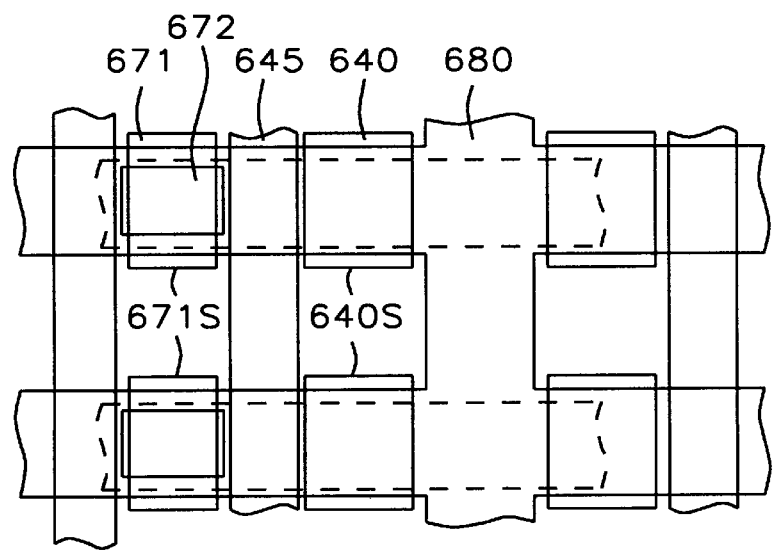
FIG. 8 is a top view of the split gate with the double side wall short channel split flash transistor of the invention.

The normal processing follows with the deposition of a passivation layer such as phosphosilicate glass (PSG), planarization by Chemical Mechanical Polishing, opening of the contact holes, filling of the contact holes using tungsten, W, aluminum, Al, or copper, Cu, and metalization for wiring. The bird's eye or top view of the memory cell is shown in FIG. 8. A short channel device which has efficiency of electron injection from channel to floating gate is thereby achieved. Thus, the channel length, and N drain lengths under the floating gate of the split gate memory cell can be precisely defined by two side wall techniques. Self aligned contacts filled with polysilicon are also provided.

While the invention has been particularly shown and described with reference to the preferred embodiments thereof, it will be understood by those skilled in the art that various changes in form and details may be made without departing from the spirit and scope of the invention.

What is claimed is:

1. The method of fabricating an electrically programmable split gate memory device which has efficiency of electron injection from the channel to floating gate comprising:

providing a substrate having a Source region with an adjacent planar channel and a control gate over said channel;

forming a drain region having a floating gate beside said control gate, separated by an oxide layer from said contact, said floating gate is located over said drain region; and wherein the horizontal distance between the vertical edge of said control gate to the closest edge of said drain is less than about 100 nm; wherein said horizontal distance is reproducible between +/−5%; and said horizontal distance is defined by a silicon nitride sidewall spacer mask on the side of said control gate.

2. The method of claim 1 and further comprising forming a P region between said vertical edge of said control gate and said closest edge of said drain.

3. The method of claim 1 wherein said control gate is connected as a word line of said memory device.

4. The method of claim 1 wherein said floating gate is a polysilicon sidewall spacer adjacent to said control gate.

5. The method of fabricating an electrically programmable split gate memory device which has efficiency of electron injection from the channel to a floating gate comprising:

providing a substrate having a source region with an adjacent planar channel and a control gate over said channel;

forming a first floating gate oxide layer over the sidewall of said control gate;

forming a silicon nitride sidewall spacer layer over said first floating gate oxide layer on the sidewall of said control gate;

using said silicon nitride spacer layer as a mask to form an N region within said substrate in the area whereat a floating gate is to be form formed;

removing said silicon nitride spacer layer;

forming a second floating gate oxide layer over said substrate;

completing the formation of an N+ drain region within said N region by using said control gate as the mask; and forming said floating gate at the side of said control gate and over said first and second floating gate oxide layers on said sidewall of said control gate and said substrate.

6. The method of claim 5 wherein the horizontal distance between the vertical edge of said control gate to the closest edge of said drain is less than about 100 nm; and wherein said horizontal distance is reproducible between +/−5%.

7. The method of claim 6 and further comprising:

after removing said silicon nitride sidewall spacer layer, forming a P region between said vertical edge of said control gate and said closest edge of said drain.

8. The method of claim 5 wherein said control gate is connected as a word line of said memory device.

9. The method of claim 6 wherein said horizontal distance is defined by a silicon nitride sidewall spacer mask on the side of said control gate.

10. The method of claim 5 wherein said floating gate is a polysilicon sidewall spacer adjacent to said control gate.

* * * * *